United States Patent
Miyamoto et al.

(10) Patent No.: US 9,214,533 B2
(45) Date of Patent: Dec. 15, 2015

(54) SEMICONDUCTOR DEVICE HAVING TRANSPARENT ELECTRODES

(71) Applicant: Sharp Kabushiki Kaisha, Osaka-shi, Osaka (JP)

(72) Inventors: Tadayoshi Miyamoto, Osaka (JP); Kazuatsu Ito, Osaka (JP); Shigeyasu Mori, Osaka (JP); Mitsunobu Miyamoto, Osaka (JP); Yasuyuki Ogawa, Osaka (JP); Makoto Nakazawa, Osaka (JP); Takuya Matsuo, Osaka (JP); Seiichi Uchida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/375,917

(22) PCT Filed: Jan. 24, 2013

(86) PCT No.: PCT/JP2013/051422
§ 371 (c)(1),
(2) Date: Jul. 31, 2014

(87) PCT Pub. No.: WO2013/115052
PCT Pub. Date: Aug. 8, 2013

(65) Prior Publication Data
US 2014/0367677 A1    Dec. 18, 2014

(30) Foreign Application Priority Data
Jan. 31, 2012 (JP) ................................ 2012-018751

(51) Int. Cl.
*H01L 29/66* (2006.01)
*H01L 29/45* (2006.01)
(Continued)

(52) U.S. Cl.
CPC .......... *H01L 29/66969* (2013.01); *H01L 21/44* (2013.01); *H01L 23/564* (2013.01);
(Continued)

(58) Field of Classification Search
CPC ..................... H01L 29/66969; H01L 29/7869; H01L 29/45; H01L 23/564; H01L 27/1225; H01L 27/127
See application file for complete search history.

(56) References Cited

U.S. PATENT DOCUMENTS 7,804,091 B2 *  9/2010  Takechi et al. .................. 257/59
7,982,215 B2 *  7/2011  Inoue et al. ...................... 257/43
(Continued)

FOREIGN PATENT DOCUMENTS

JP    2008-40343 A    2/2008
JP    2009-99944 A    5/2009
(Continued)

OTHER PUBLICATIONS

Official Communication issued in International Patent Application No. PCT/JP2013/051422, mailed on Apr. 16, 2013.

*Primary Examiner* — Ida M Soward
(74) *Attorney, Agent, or Firm* — Keating & Bennett, LLP

(57) ABSTRACT

This semiconductor device (100A) includes: a substrate (2); a gate electrode (3) formed on the substrate (2); a gate insulating layer (4) formed over the gate electrode (3); an oxide semiconductor layer (5) formed on the gate insulating layer (4); source and drain electrodes (6s, 6d) electrically connected to the oxide semiconductor layer (5); a first transparent electrode (7) electrically connected to the drain electrode (6d); an interlayer insulating layer (8) including a dielectric layer (8a) formed over the source and drain electrodes (6s, 6d); and a second transparent electrode (9) formed on the interlayer insulating layer (8). At least a portion of the second transparent electrode (9) overlaps with the first transparent electrode (7) with the dielectric layer (8a) interposed between them, and the oxide semiconductor layer (5) and the first transparent electrode (7) are formed out of the same oxide film.

16 Claims, 6 Drawing Sheets

(51) Int. Cl.
- *H01L 27/12* (2006.01)
- *H01L 23/00* (2006.01)
- *H01L 29/786* (2006.01)
- *H01L 21/02* (2006.01)
- *H01L 21/44* (2006.01)
- *G02F 1/1362* (2006.01)
- *G02F 1/1343* (2006.01)

(52) U.S. Cl.
CPC .......... *H01L27/127* (2013.01); *H01L 27/1225* (2013.01); *H01L 29/45* (2013.01); *H01L 29/7869* (2013.01); *G02F 1/136213* (2013.01); *G02F 2001/134372* (2013.01); *G02F 2201/40* (2013.01); *G02F 2201/50* (2013.01); *H01L 21/02565* (2013.01)

(56) References Cited

U.S. PATENT DOCUMENTS

| | | | |
|---|---|---|---|
| 7,998,372 B2* | 8/2011 | Yano et al. | 252/519.51 |
| 8,094,251 B2* | 1/2012 | Hung | 349/43 |
| 8,462,281 B2* | 6/2013 | Lee et al. | 349/39 |
| 8,481,373 B2* | 7/2013 | Okabe et al. | 438/151 |
| 8,497,502 B2* | 7/2013 | Yaegashi | 257/43 |
| 8,557,620 B2* | 10/2013 | Hong et al. | 438/34 |
| 8,669,557 B2* | 3/2014 | Kwack et al. | 257/59 |
| 2008/0035920 A1 | 2/2008 | Takechi et al. | |
| 2010/0123132 A1* | 5/2010 | Nakata et al. | 257/43 |
| 2010/0134710 A1 | 6/2010 | Ishitani et al. | |
| 2010/0163860 A1* | 7/2010 | Yano et al. | 257/43 |
| 2010/0163863 A1* | 7/2010 | Yaegashi | 257/43 |
| 2010/0213459 A1 | 8/2010 | Shimada et al. | |
| 2011/0050551 A1 | 3/2011 | Ota et al. | |
| 2011/0128275 A1* | 6/2011 | Ueda et al. | 345/212 |
| 2012/0108018 A1* | 5/2012 | Okabe et al. | 438/158 |
| 2012/0138922 A1 | 6/2012 | Yamazaki et al. | |
| 2012/0280236 A1* | 11/2012 | Kim | 257/59 |
| 2013/0099227 A1 | 4/2013 | Nakagawa et al. | |

FOREIGN PATENT DOCUMENTS

| | | |
|---|---|---|
| JP | 2010-156960 A | 7/2010 |
| JP | 2011-053443 A | 3/2011 |
| JP | 2011-091279 A | 5/2011 |
| JP | 2012-134475 A | 7/2012 |
| WO | 20111010415 A1 | 1/2011 |
| WO | 20111030582 A1 | 3/2011 |

* cited by examiner (a)

(b)

(a)

(b)

(c)

(a)

(b)

(c)

(a)

(b)

(c)

SEMICONDUCTOR DEVICE HAVING TRANSPARENT ELECTRODES

TECHNICAL FIELD

The present invention relates to a semiconductor device which has been formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be simply referred to herein as "TFTs"), each of which is provided for an associated one of pixels. An active-matrix substrate including TFTs as switching elements is called a "TFT substrate".

As for TFTs, a TFT which uses an amorphous silicon film as its active layer (and will be referred to herein as an "amorphous silicon TFT") and a TFT which uses a polysilicon film as its active layer (and will be referred to herein as a "polysilicon TFT") have been used extensively.

Recently, people have proposed that an oxide semiconductor be used as a material for the active layer of a TFT instead of amorphous silicon or polysilicon. Such a TFT will be referred to herein as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

Patent Document No. 1 discloses a method for fabricating a TFT substrate including oxide semiconductor TFTs. According to the method disclosed in Patent Document No. 1, a TFT substrate can be fabricated in a reduced number of manufacturing process steps by forming a pixel electrode with the resistance of the oxide semiconductor layer locally decreased.

Recently, as the definition of liquid crystal display devices and other devices has become higher and higher, a decrease in pixel aperture ratio has become an increasingly serious problem. In this description, the "pixel aperture ratio" refers herein to the ratio of the combined area of pixels (e.g., the combined area of regions which transmit light that contributes to a display operation in a transmissive liquid crystal display device) to the overall display area. In the following description, the "pixel aperture ratio" will be simply referred to herein as an "aperture ratio".

Among other things, a medium to small sized transmissive liquid crystal display device to be used in a mobile electronic device has so small a display area that each of its pixels naturally has a very small area and the aperture ratio will decrease particularly significantly when the definition is increased. On top of that, if the aperture ratio of a liquid crystal display device to be used in a mobile electronic device decreases, the luminance of the backlight needs to be increased to achieve an intended brightness, thus causing an increase in power dissipation, too.

To achieve a high aperture ratio, the combined area occupied by a TFT, a storage capacitor, and other elements of a non-transparent material in each pixel may be decreased. However, naturally, the TFT and the storage capacitor should have their minimum required size to perform their function. When oxide semiconductor TFTs are used as TFTs, the TFTs can have a smaller size than when amorphous silicon TFTs are used, which is advantageous. It should be noted that in order to maintain a voltage that has been applied to the liquid crystal layer of a pixel (which is called a "liquid crystal capacitor" electrically), the "storage capacitor" is provided electrically in parallel with the liquid crystal capacitor. In general, at least a portion of the storage capacitor is arranged so as to overlap with the pixel.

CITATION LIST

Patent Literature

Patent Document No. 1: Japanese Laid-Open Patent Publication No. 2011-91279

SUMMARY OF INVENTION

Technical Problem

However, demands for increased aperture ratios are too huge to satisfy just by using oxide semiconductor TFTs. Meanwhile, as the prices of display devices have become lower and lower year after year, development of a technology for manufacturing high-aperture-ratio display devices at a lower cost is awaited.

Thus, a primary object of an embodiment of the present invention is to provide a TFT substrate which can be fabricated by a simpler process and which can contribute to realizing a display device with higher definition and a higher aperture ratio than conventional ones and also provide a method for fabricating such a TFT substrate.

Solution to Problem

A semiconductor device according to an embodiment of the present invention includes: a substrate; a gate electrode formed on the substrate; a gate insulating layer formed over the gate electrode; an oxide semiconductor layer formed on the gate insulating layer; source and drain electrodes electrically connected to the oxide semiconductor layer; a first transparent electrode electrically connected to the drain electrode; an interlayer insulating layer including a dielectric layer formed over the source and drain electrodes; and a second transparent electrode formed on the interlayer insulating layer. At least a portion of the second transparent electrode overlaps with the first transparent electrode with the dielectric layer interposed between them, and the oxide semiconductor layer and the first transparent electrode are formed out of the same oxide film.

In one embodiment, the drain electrode is formed on the first transparent electrode, which contacts directly with the drain electrode.

In one embodiment, the semiconductor device further includes an insulating protective layer which is formed on the source and drain electrodes, which is formed to contact with a channel region of the oxide semiconductor layer, and which is made of an oxide.

In one embodiment, at least one of the gate insulating layer and the dielectric layer includes an oxide insulating layer, which contacts with the oxide semiconductor layer.

In one embodiment, the oxide film includes In, Ga and Zn.

In one embodiment, the first transparent electrode contains an impurity at a higher concentration than the oxide semiconductor layer, and a portion of the interlayer insulating layer located over the first transparent electrode contains the impurity at a higher concentration than the other portion thereof.

In one embodiment, the oxide semiconductor layer includes an In—Ga—Zn—O based semiconductor.

A method for fabricating a semiconductor device according to an embodiment of the present invention includes the steps of: (a) providing a substrate; (b) forming a gate electrode and a gate insulating layer on the substrate; (c) forming an oxide semiconductor film on the gate insulating layer; (d) forming source and drain electrodes on the oxide semiconductor film; (e) forming a protective layer to protect a channel region of the oxide semiconductor film, and then performing a resistance lowering process to lower a resistance of a portion of the oxide semiconductor film, thereby forming a first transparent electrode and turning the rest of the oxide semiconductor film where the first transparent electrode is not formed into an oxide semiconductor layer; (f) forming a dielectric layer over the source and drain electrodes; and (g) forming a second transparent electrode on the dielectric layer. At least a portion of the second transparent electrode overlaps with the first transparent electrode with the dielectric layer interposed between them.

In one embodiment, the step (e) is performed between the steps (d) and (f).

In one embodiment, the step (e) is performed between the steps (f) and (g).

In one embodiment, the step (e) includes forming the first transparent electrode by implanting an impurity through the dielectric layer.

In one embodiment, the step (e) is performed after the step (g).

In one embodiment, the step (e) includes forming the first transparent electrode by implanting an impurity through the dielectric layer and the second transparent electrode.

In one embodiment, the protective layer is an oxide insulating layer.

In one embodiment, when viewed along a normal to the substrate, an end portion of the protective layer overlaps with the drain electrode.

In one embodiment, the oxide semiconductor film includes an In—Ga—Zn—O based semiconductor.

Advantageous Effects of Invention

An embodiment of the present invention provides a TFT substrate which can be fabricated by a simpler process and which can contribute to realizing a display device with higher definition and a higher aperture ratio than conventional ones and also provides a method for fabricating such a TFT substrate.

DESCRIPTION OF EMBODIMENTS

Hereinafter, a semiconductor device according to an embodiment of the present invention will be described with reference to the accompanying drawings. A semiconductor device according to this embodiment includes a thin-film transistor which has an active layer made of an oxide semiconductor (and which will be referred to herein as an "oxide semiconductor TFT"). A semiconductor device according to this embodiment just needs to include an oxide semiconductor TFT and may be implemented broadly as an active-matrix substrate or any of various kinds of display devices and electronic devices. In the following description, a semiconductor device according to an embodiment of the present invention will be described as being applied to an oxide semiconductor TFT for use in a liquid crystal display device.

Figure 1:
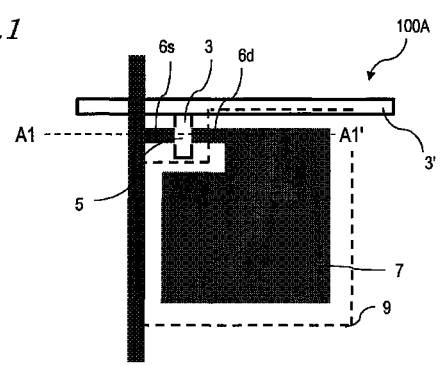
FIG. 1 (*a*) is a schematic plan view illustrating a TFT substrate 100A according to an embodiment of the present invention. (*b*) is a schematic cross-sectional view of the TFT substrate 100A as viewed on the plane A1-A1' shown in (*a*). And (*c*) is a schematic cross-sectional view of a liquid crystal display device 500 including the TFT substrate 100A.
Figure 1:
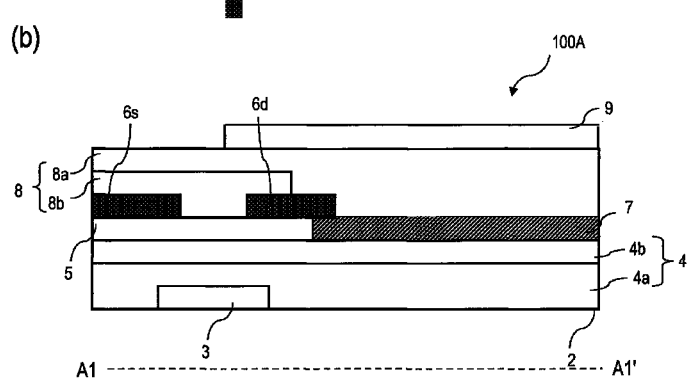
Figure 1:
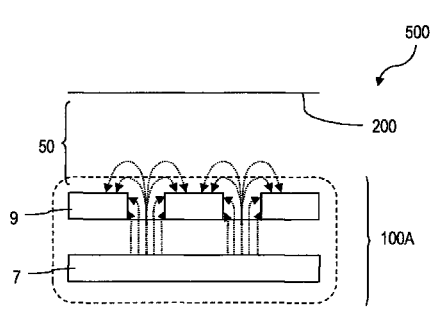

FIG. 1(*a*) is a schematic plan view illustrating a TFT substrate 100A according to this embodiment. FIG. 1(*b*) is a schematic cross-sectional view of the semiconductor device (TFT substrate) 100A as viewed on the plane A1-A1' shown in FIG. 1(*a*). And FIG. 1(*c*) is a schematic cross-sectional view of a liquid crystal display device 500 including the TFT substrate 100A. In FIG. 1(*c*), the dotted arrows indicate the directions of an electric field.

This TFT substrate 100A includes: a substrate 2; a gate electrode 3 which has been formed on the substrate 2; a gate insulating layer 4 which has been formed over the gate electrode 3; an oxide semiconductor layer 5 which has been formed on the gate insulating layer 4; source and drain electrodes 6*s*, 6*d* which are electrically connected to the oxide semiconductor layer 5; a first transparent electrode 7 which is electrically connected to the drain electrode 6*d*; an interlayer insulating layer 8 including a dielectric layer 8*a* which has been formed over the source and drain electrodes 6*s*, 6*d*; and a second transparent electrode 9 which has been formed on the interlayer insulating layer 8. At least a portion of the second transparent electrode 9 overlaps with the first transparent electrode 7 with the dielectric layer 8*a* interposed between them. The oxide semiconductor layer 5 and the first transparent electrode 7 are formed out of the same oxide film.

In this TFT substrate 100A, at least a portion of the second transparent electrode 9 overlaps with the first transparent electrode 7 with the dielectric layer 8*a* interposed between them, thereby forming a storage capacitor there. That is why the storage capacitor this TFT substrate 100A has is transparent (i.e., transmits visible light), and therefore, does not decrease the aperture ratio. Consequently, this TFT substrate 100A can have a higher aperture ratio than a TFT substrate, of which the storage capacitor includes a non-transparent electrode that has been formed out of a metal film (i.e., either a gate metal layer or a source metal layer) as in a conventional structure. In addition, since the aperture ratio is not decreased by the storage capacitor, the capacitance value of the storage capacitor (i.e., the area of the storage capacitor) can be increased as needed, which is also beneficial.

Furthermore, it is preferred that the drain electrode 6*d* be formed on, and contact directly with, the first transparent electrode 7. By adopting such a structure, the first transparent electrode 7 can be extended to reach approximately an end portion of the drain electrode 6*d*. As a result, this TFT substrate 100A can have a higher aperture ratio than the TFT substrate disclosed in Patent Document No. 1.

Hereinafter, the respective components of this TFT substrate 100A will be described in detail one by one.

The substrate 2 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 2 may also be a silicon substrate.

The gate electrode 3 is electrically connected to a gate line 3'. The gate electrode 3 and the gate line 3' may have a multilayer structure, of which the upper layer is a W (tungsten) layer and the lower layer is a TaN (tantalum nitride) layer, for example. Alternatively, the gate electrode 3 and the gate line 3' may also have a multilayer structure consisting of Mo (molybdenum), Al (aluminum) and Mo layers or may even have a single-layer structure, a double layer structure, or a multilayer structure consisting of four or more layers. Still alternatively, the gate electrode 3*a* may be made of an element selected from the group consisting of Cu (copper), Al, Cr (chromium), Ta (tantalum), Ti (titanium), Mo and w or an alloy or metal nitride which is comprised mostly of any of these elements. The thickness of the gate electrode 3 falls within the range of about 50 nm to about 600 nm. In this embodiment, the gate electrode 3 has a thickness of approximately 420 nm.

The gate insulating layer 4 includes a lower gate insulating layer 4*a* and an upper gate insulating layer 4*b*. The upper gate insulating layer 4*b* suitably includes an oxide insulating layer, which suitably contacts with the oxide semiconductor layer 5. If the oxide insulating layer directly contacts with the oxide semiconductor layer 5, oxygen included in the oxide insulating layer will be supplied to the oxide semiconductor layer 5, thus preventing oxygen deficiencies of the oxide semiconductor layer 5 from deteriorating the properties of the semiconductor. The upper gate insulating layer 4*b* may be an $SiO_2$ (silicon dioxide) layer, for example. The lower gate insulating layer 4*a* may be an $SiN_x$ (silicon nitride) layer, for example. In this embodiment, the lower gate insulating layer 4*a* may have a thickness of approximately 325 nm, the upper gate insulating layer 4*b* may have a thickness of approximately 50 nm, and the gate insulating layer 4 may have an overall thickness of approximately 375 nm, for example. Alternatively, the gate insulating layer 4 may also be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the gate insulating layer 4 suitably falls within the range of about 50 nm to about 600 nm. To prevent impurities from diffusing from the substrate 2, the lower gate insulating layer 4*a* is suitably made of $SiN_x$ or $SiN_xO_y$ (silicon oxynitride, where x>y). Moreover, to prevent the semiconductor properties of the oxide semiconductor layer 5 from deteriorating, the upper gate insulating layer 4*b* is suitably made of either $SiO_2$ or $SiO_xN_y$ (silicon nitride oxide, where x>y). Furthermore, to form a dense gate insulating layer 4 which causes little gate leakage current at low temperatures, the gate insulating layer 4 is suitably formed using a rare gas of Ar (argon), for example. The oxide semiconductor layer 5 may include an In—Ga—Zn—O based semiconductor (which will be referred to herein as an "IGZO based semiconductor"), for example. In this case, the IGZO based semiconductor is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied. The IGZO based semiconductor may be either amorphous or crystalline. If the IGZO based semiconductor is a crystalline one, a crystalline IGZO based semiconductor of which the c axis is substantially perpendicular to the layer plane is suitably used. The crystal structure of such an IGZO based semiconductor is disclosed, for example, in Japanese Laid-Open Patent Publication No. 2012-134475, the entire disclosure of which is hereby incorporated by reference.

The oxide semiconductor material that makes the oxide semiconductor layer 5 does not have to be an IGZO based semiconductor, but may also be a Zn—O based semiconductor (ZnO), an In—Zn—O based semiconductor (IZO™), a Zn—Ti—O based semiconductor (ZTO), a Cd—Ge—O based semiconductor, a Cd—Pb—O based semiconductor, CdO (cadmium oxide), an Mg—Zn—O based semiconductor, an In—Sn—Zn—O based semiconductor (such as $In_2O_3$—$SnO_2$—ZnO) or an In—Ga—Sn—O based semiconductor, for example. Furthermore, the oxide semiconductor layer 5 may also be ZnO in an amorphous state, a polycrystalline state, or a microcrystalline state (which is a mixture of amorphous and polycrystalline states) to which one or multiple impurity elements selected from the group consisting of Group I, Group XIII, Group XIV, Group XV and Group XVII elements have been added, or may even be ZnO to which no impurity elements have been added at all. If an amorphous oxide semiconductor layer is used as the oxide semiconductor layer 5, the semiconductor device can be fabricated at a low temperature and can achieve high mobility. The oxide semiconductor layer 5 may have a thickness of approximately 50 nm, for example. The thickness of the oxide semiconductor layer 5 may fall within the range of about 30 nm to about 100 nm, for example.

The source and drain electrodes 6*s* and 6*d* may have a multilayer structure comprised of Ti, Al and Ti layers, for example. Alternatively, the source and drain electrodes 6*s* and 6*d* may also have a multilayer structure comprised of Mo, Al and Mo layers or may even have a single-layer structure, a double layer structure or a multilayer structure consisting of four or more layers. Furthermore, the source and drain electrodes 6*s* and 6*d* may also be made of an element selected from the group consisting of Al, Cr, Ta, Ti, Mo and W, or an alloy or metal nitride comprised mostly of any of these elements. The thicknesses of the source and drain electrodes 6*s* and 6*d* fall within the range of about 50 nm to about 600 nm. In this embodiment, the source and drain electrodes 6*s* and 6*d* have a thickness of approximately 350 nm.

The interlayer insulating layer 8 is comprised of a dielectric layer 8*a* and an insulating protective layer 8*b*. As will be described later, the insulating protective layer 8*b* is sometimes omitted. The dielectric layer 8*a* may be made of $SiN_x$, for example. The dielectric layer 8 is arranged between the first and second transparent electrodes 7 and 9 to form a storage capacitor there. If a storage capacitor is formed of those transparent electrodes 7 and 9 and the transparent dielectric layer 8a in this manner, a display panel with a high aperture ratio can be fabricated when this TFT substrate 100A is used to make a display panel. The thickness of the dielectric layer 8a falls within the range of about 100 nm to about 500 nm. In this embodiment, the dielectric layer 8a has a thickness of approximately 200 nm. Alternatively, the dielectric layer 8a may also be made of $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$), for example.

The insulating protective layer 8b has been formed to contact with the channel region of the oxide semiconductor layer 5. The insulating protective layer 8b is suitably made of an insulating oxide (such as $SiO_2$). If the insulating protective layer 8b is made of an insulating oxide, it is possible to prevent the oxygen deficiencies of the oxide semiconductor layer 5 from deteriorating the semiconductor properties as described above. Alternatively, the insulating protective layer 8b may also be made of SiON (which may be either silicon oxynitride or silicon nitride oxide), $Al_2O_3$ or $Ta_2O_5$, for example. The thickness of the insulating protective layer 8b falls within the range of about 50 nm to about 300 nm, for example. In this embodiment, the insulating protective layer 8b has a thickness of about 150 nm.

The first transparent electrode 7 may be a conductive layer including an In—Ga—Zn—O based oxide (which will be referred to herein as an "IGZO based oxide"), for example. The first transparent electrode 7 has a thickness of about 50 nm, for example. The thickness of the first transparent electrode 7 may fall within the range of about 20 nm to about 200 nm, for example. As will be described in detail later, the first transparent electrode 7 and the oxide semiconductor layer 5 are formed out of the same transparent oxide film. If the first transparent electrode 7 and the oxide semiconductor layer 5 are formed out of the same oxide film, the manufacturing process can be simplified and the manufacturing cost can be cut down. As the oxide film, a film including an IGZO based oxide such as an IGZO based semiconductor film may be used, for example. As mentioned above, in this description, an IGZO based oxide with semiconductor properties will be referred to herein as an "IGZO based semiconductor".

As will be described in detail later, the first transparent electrode 7 is doped more heavily with either a p-type impurity (such as B (boron)) or an n-type impurity (such as P (phosphorus)) than the oxide semiconductor layer 5 is. A portion of the interlayer insulating layer 8 which is located over the first transparent electrode 7 may also be doped more heavily with a p-type impurity or an n-type impurity than the rest of the layer 8.

The second transparent electrode 9 is formed out of a transparent conductive film (of ITO (indium tin oxide) or IZO, for example). The thickness of the second transparent electrode 9 falls within the range of about 20 nm to about 200 nm, for example. In this embodiment, the second transparent electrode 9 has a thickness of about 100 nm.

As shown in FIG. 1(c), the TFT substrate 100A may be used in a fringe field switching (FFS) mode liquid crystal display device 500, for example. In this case, the first transparent electrode 7 that forms the lower layer is used as a pixel electrode (to which a display signal voltage is applied) and the second transparent electrode 9 that forms the upper layer is used as a common electrode (to which either a common voltage or a counter voltage is applied). At least one slit is cut through the second transparent electrode 9. An FFS mode liquid crystal display device 500 with such a configuration is disclosed in Japanese Laid-Open Patent Publication No. 2011-53443, for example, the entire disclosure of which is hereby incorporated by reference.

This liquid crystal display device 500 includes a TFT substrate 100A, a counter substrate 200, and a liquid crystal layer 50 interposed between the TFT substrate 100A and the counter substrate 200. In this liquid crystal display device 500, no counter electrode such as a transparent electrode of ITO, for example, is arranged on the surface of the counter substrate 200 to face the liquid crystal layer 50. Instead, a display operation is carried out by controlling the alignments of liquid crystal molecules in the liquid crystal layer 50 with a lateral electric field which has been generated by the first and second transparent electrodes (i.e., the pixel electrode and the common electrode) 7 and 9 that have been formed on the TFT substrate 100A.

Figure 2:
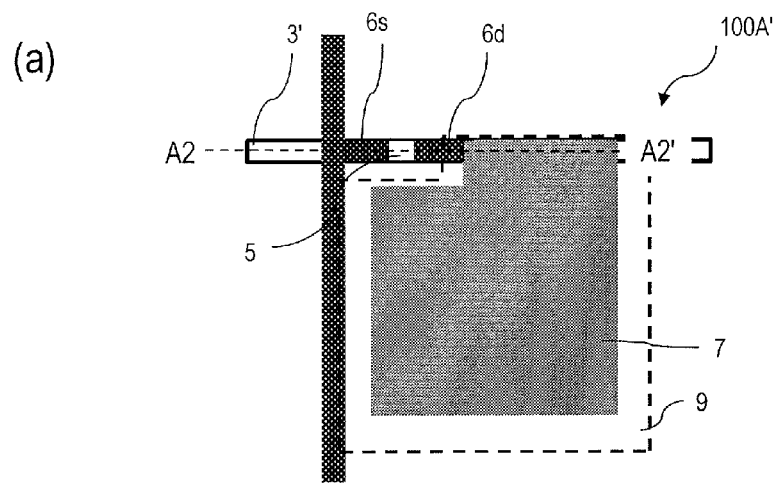
FIG. 2 (*a*) is a schematic plan view illustrating a TFT substrate 100A' as a modified example. (*b*) is a schematic cross-sectional view of the TFT substrate 100A' as viewed on the plane A2-A2' shown in (*a*).
Figure 2:
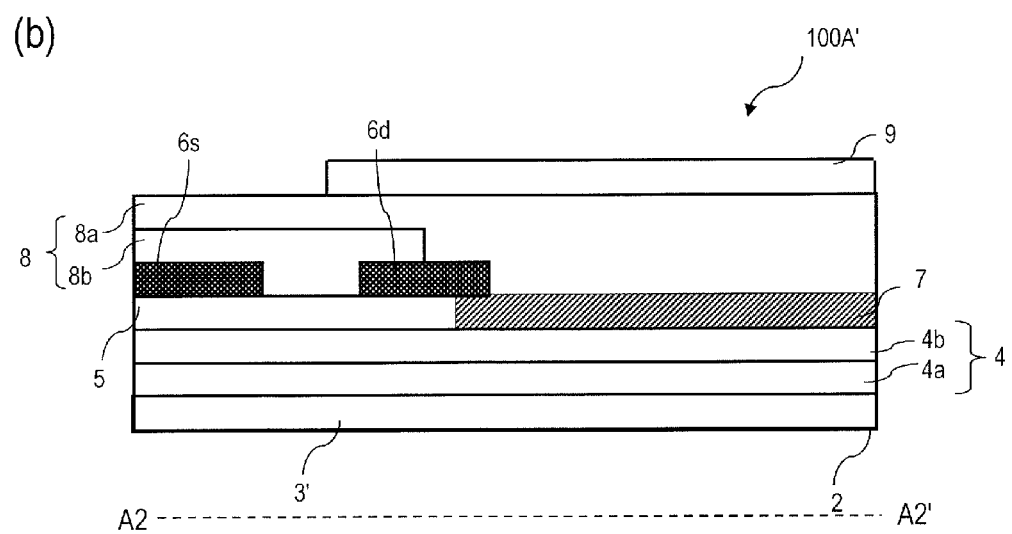

The TFT substrate 100A may be modified into the TFT substrate 100A' shown in FIG. 2. FIG. 2(a) is a schematic plan view illustrating a TFT substrate 100A' as a modified example. FIG. 2(b) is a schematic cross-sectional view of the TFT substrate 100A' as viewed on the plane A2-A2' shown in FIG. 2(a).

The TFT substrate 100A' shown in FIGS. 2(a) and 2(b) includes an oxide semiconductor layer 5 which overlaps with a gate line 3' and has a structure in which when viewed along a normal to the substrate 2, the gate line 3' and the source and drain electrodes 6s, 6d overlap with each other, which is a difference from the TFT substrate 100A. The TFT substrate 100A' can have an even higher aperture ratio than the TFT substrate 100A.

However, this TFT substrate 100A' has a higher gate-drain parasitic capacitance (Cgd) than the TFT substrate 100A, which is one of drawbacks of the TFT substrate 100A'. As is well known, if the gate-drain parasitic capacitance (Cgd) is large, then the feedthrough voltage rises. The feedthrough voltage would cause an image persistence phenomenon or flickers. To lower the feedthrough voltage, the ratio of the gate-drain parasitic capacitance (Cgd) to the overall capacitance of the pixel (i.e., liquid crystal capacitance Clc+storage capacitance Cs+gate-drain parasitic capacitance Cgd) needs to be decreased. This TFT substrate 100A' has a transparent storage capacitor with a transparent electrode, and therefore, can have its capacitance value increased by increasing the area of the storage capacitor without causing a decrease in aperture ratio. That is to say, even by adopting such a structure in which the gate-drain parasitic capacitance (Cgd) becomes as high as in this TFT substrate 100A', the feedthrough voltage can be reduced sufficiently.

Moreover, if a pixel's overall capacitance is large, it means that a lot of electric charges are needed to apply a predetermined voltage to the pixel. This TFT substrate 100A' includes oxide semiconductor TFTs which have higher current supplying ability than conventional amorphous silicon TFTs. That is why the display quality will never be debased by an increase in the pixel's capacitance.

Next, it will be described how to fabricate the TFT substrate 100A.

A method for fabricating a semiconductor device according to an embodiment of the present invention includes the steps of: (a) providing a substrate 2; (b) forming a gate electrode 3 and a gate insulating layer 4 on the substrate 2; (c) forming an oxide semiconductor film 5' on the gate insulating layer 4; (d) forming source and drain electrodes 6s, 6d on the oxide semiconductor film 5'; (e) forming a protective layer to protect the channel region of the oxide semiconductor film 5', and then forming a first transparent electrode 7 by performing a resistance lowering process to lower the resistance of a portion of the oxide semiconductor film 5'; (f) forming a dielectric layer 8a on the source and drain electrodes 6s, 6d; and (g) forming a second transparent electrode 9 on the dielectric layer 8a. At least a portion of the second transparent electrode 9 overlaps with the first transparent electrode 7 with the dielectric layer 8a interposed between them.

Such a method for fabricating a semiconductor device is a simplified one, and therefore, can contribute to cutting down the manufacturing cost.

Figure 3:
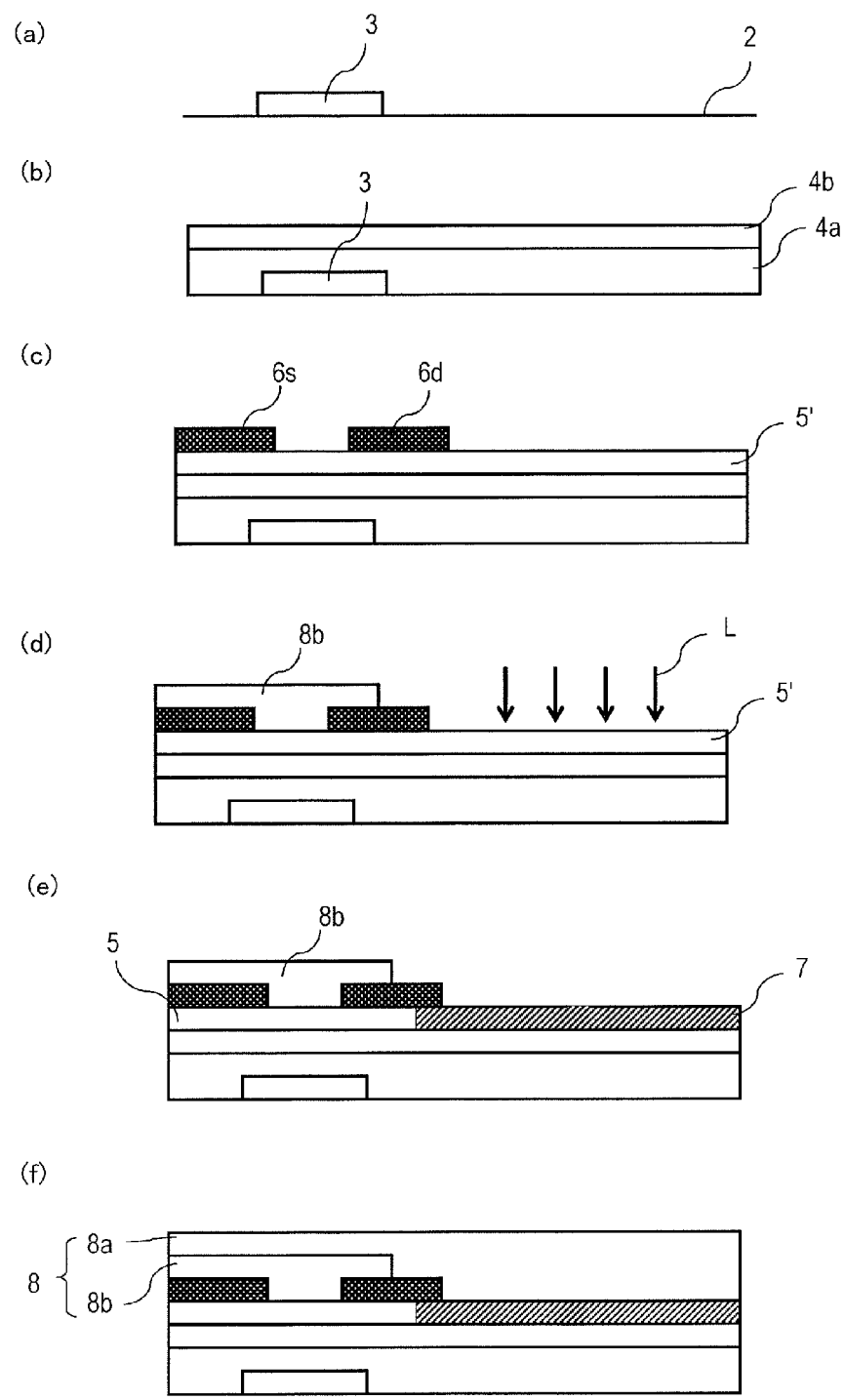
FIG. 3 (*a*) through (*f*) are schematic cross-sectional views illustrating an exemplary manufacturing process for fabricating a TFT substrate 100A according to an embodiment of the present invention.

Hereinafter, an exemplary method for fabricating the TFT substrate 100A will be described in detail with reference to FIG. 3.

FIGS. 3(a) through 3(f) are schematic cross-sectional views illustrating an exemplary method for fabricating the TFT substrate 100A.

First of all, as shown in FIG. 3(a), a gate electrode 3 is formed on a substrate 2. As the substrate 2, a transparent insulating substrate such as a glass substrate, for example, may be used. The gate electrode 3 may be formed by depositing a conductive film on the substrate 2 by sputtering process and then patterning the conductive film by photolithographic process. In this example, a multilayer film with a double layer structure consisting of a TaN film (with a thickness of about 50 nm) and a W film (with a thickness of about 370 nm) that have been stacked one upon the other in this order on the substrate 2 is used as the conductive film. As this first conductive film, a single-layer film of Ti, Mo, Ta, W, Cu, Al or Cr, a multilayer film or alloy film including any of these elements in combination, or a metal nitride film thereof may be used.

Next, as shown in FIG. 3(b), a lower gate insulating layer 4a and an upper gate insulating layer 4b are formed by CVD (chemical vapor deposition) process to cover the gate electrode 3. In this example, the lower gate insulating layer 4a is formed out of an $SiN_x$ film (with a thickness of about 325 nm) and the upper gate insulating layer 4b is formed out of an $SiO_2$ film (with a thickness of about 50 nm). The upper and lower gate insulating layers 4a, 4b may be made of $SiO_2$, $SiN_x$, $SiO_xN_y$ (silicon oxynitride, where x>y), $SiN_xO_y$ (silicon nitride oxide, where x>y), $Al_2O_3$, or $Ta_2O_5$, for example. Subsequently, as shown in FIG. 3(c), an oxide semiconductor film 5' is formed by sputtering process on the upper gate insulating layer 4b. As the oxide semiconductor film 5', an IGZO based semiconductor film may be used, for example. The oxide semiconductor film 5' may have a thickness of about 50 nm.

Thereafter, a conductive film (not shown) to be source and drain electrodes 6s and 6d is formed by sputtering process over the oxide semiconductor film 5'. Next, the conductive film and the oxide semiconductor film 5' are patterned simultaneously by photolithographic process using a half-tone mask, dry etching process and asking process, thereby turning the oxide semiconductor film 5' into an intended shape and forming source and drain electrodes 6s and 6d. Since the source and drain electrodes 6s and 6d can be formed and the oxide semiconductor film 5' can be patterned in this manner using a single photomask, the manufacturing process can be simplified and the manufacturing cost can be cut down. The source and drain electrodes 6s and 6d may have a multilayer structure consisting of Ti, Al and Ti layers, for example. The lower Ti layer may have a thickness of about 50 nm, the Al layer may have a thickness of about 200 nm, and the upper Ti layer may have a thickness of about 100 nm.

Subsequently, as shown in FIG. 3(d), an insulating protective layer 8b is formed by sputtering and photolithographic processes so as to cover the channel region of the oxide semiconductor layer 5. The insulating protective layer 8b may be made of an insulating oxide (such as $SiO_2$), for example, and may have a thickness of about 150 nm. Also, when viewed along a normal to the substrate 2, an end portion of the insulating protective layer 8b suitably overlaps with the drain electrode 6d. The reason is that the first transparent electrode 7 can be extended to the vicinity of the end portion of the drain electrode 6d in that case.

Thereafter, a portion of the oxide semiconductor film 5' is subjected to a resistance lowering process L. The rest of the oxide semiconductor film 5' which is covered with the source and drain electrodes 6s, 6d and the insulating protective layer 8b is not subjected to the resistance lowering process L. As a result, as shown in FIG. 3(e), that portion of the oxide semiconductor film 5' that has been subjected to the resistance lowering process L turns into a first transparent electrode 7, while the other portion that has not been subjected to the resistance lowering process L turns into an oxide semiconductor layer 5. Naturally, the electrical resistance of that portion subjected to the resistance lowering process L is lower than that of the other portion not subjected to the resistance lowering process L. The resistance lowering process L may be plasma processing or doping a p-type or n-type impurity, for example. If a p-type or n-type impurity doping process is adopted as the resistance lowering process L, then the impurity concentration of the first transparent electrode 7 is higher than that of the oxide semiconductor layer 5. Also, due to diffusion of the impurity, a portion of the oxide semiconductor film 5' which is located under the drain electrode 6d may sometimes have its resistance lowered and form part of the first transparent electrode 7. As will be described later, when a doping system is used to implant a impurity, the resistance lowering process can be carried out with the impurity implanted through an insulating layer, and therefore, it is possible to cope with various manufacturing processes flexibly.

Examples of alternative resistance lowering processes L include hydrogen plasma processing using a CVD system, argon plasma processing using an etching system, and an annealing process under a reducing ambient.

Next, as shown in FIG. 3(f), a dielectric layer 8a is deposited by CVD process over the first transparent electrode 7 and the insulating protective layer 8b to form an interlayer insulating layer 8. The dielectric layer 8a may be made of $SiN_x$, for example. The dielectric layer 8a may have a thickness of about 200 nm. A contact hole (not shown) has been cut through the dielectric layer 8a by a known method.

Subsequently, as shown in FIG. 1(b), a second transparent electrode 9 is formed on the dielectric layer 8a by sputtering process, for example. At least a portion of the second transparent electrode 9 overlaps with the first transparent electrode 7 with the dielectric layer 8a interposed between them. The second transparent electrode 9 may be made of ITO, for example, and may have a thickness of about 100 nm.

Although not shown, the transparent conductive film to be patterned into this second transparent electrode 9 may be used as not only a common electrode but also an extended line to be electrically connected to a source metal layer that has been formed out of the same conductive film as a source line (source bus line) or a gate metal layer that has been formed out of the same conductive film as a gate line (gate bus line). As a result, a TFT substrate including an integrated driver can be formed and a display device of high quality can be fabricated.

Figure 4:
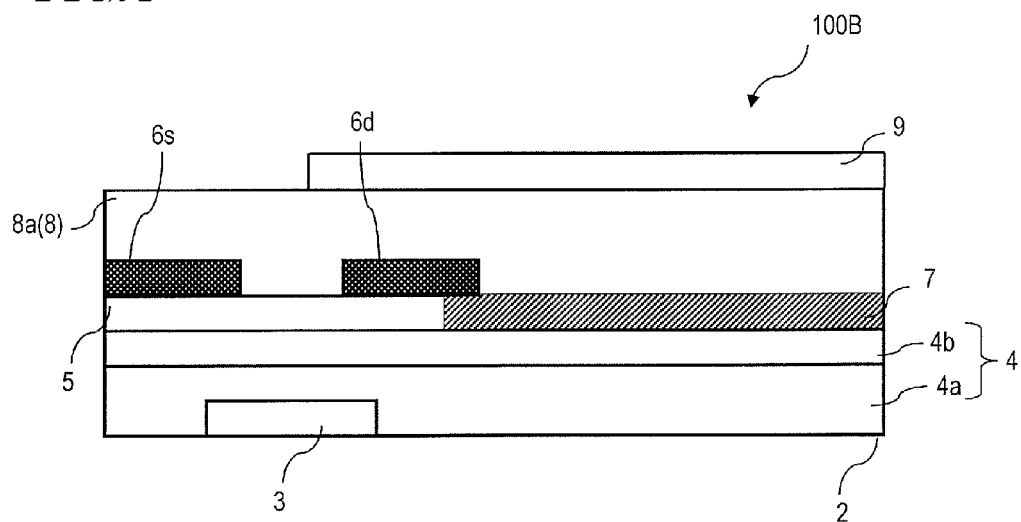
FIG. 4 A schematic cross-sectional view of a TFT substrate 100B according to another embodiment of the present invention.

Hereinafter, a TFT substrate 100B according to another embodiment of the present invention will be described with reference to FIG. 4, which is a schematic cross-sectional view of the TFT substrate 100B and which corresponds to the cross-sectional view of the TFT substrate 100A shown in FIG. 1(b). In FIG. 4, any component also included in the TFT substrate 100A and having substantially the same function as its counterpart is identified by the same reference numeral and its description will be omitted herein to avoid redundancies.

The TFT substrate 100B shown in FIG. 4 is a semiconductor device which does not include the insulating protective layer 8b of the TFT substrate 100A. Thus, in this TFT substrate 100B, the interlayer insulating layer 8 does include a dielectric layer 8a but does not include any insulating protective layer 8b. In this TFT substrate 100B, the dielectric layer 8a is suitably made of an insulating oxide (such as $SiO_2$), because it is possible to prevent the semiconductor properties of the oxide semiconductor layer 5 from deteriorating in that case, as described above.

Also, as will be described in detail later, in this TFT substrate 100B, a portion of the interlayer insulating layer 8 which is located over the first transparent electrode 7 may be sometimes doped with a p-type or n-type impurity more heavily than the other portion.

Figure 5:
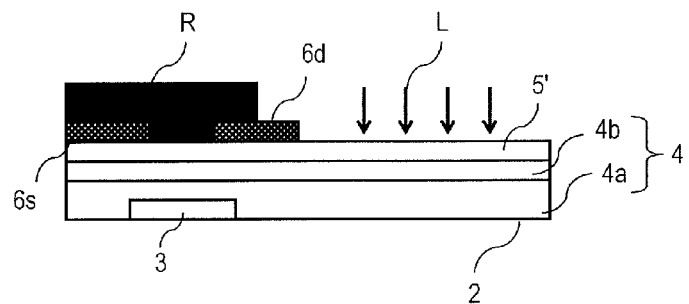
FIGS. 5 (*a*) through (*c*) are schematic cross-sectional views illustrating an exemplary manufacturing process for fabricating a TFT substrate 100B according to an embodiment of the present invention.
Figure 5:
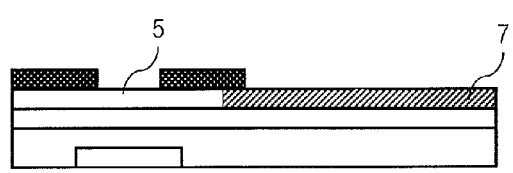
Figure 5:
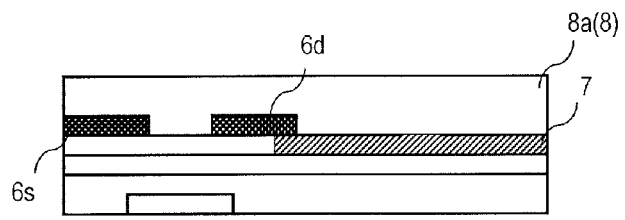

Hereinafter, an exemplary method for fabricating this TFT substrate 100B will be described with reference to FIG. 5. Specifically, FIGS. 5(a) to 5(c) are schematic cross-sectional views illustrating respective manufacturing process steps to fabricate the TFT substrate 100B.

First, a gate electrode 3, a gate insulating layer 4, an oxide semiconductor film 5' and source and drain electrodes 6s, 6d are formed as described above on a substrate 2 (see FIGS. 3(a) to 3(c)).

Next, as shown in FIG. 5(a), a protective layer R (which will be sometimes referred to herein as a "resist mask layer") is formed by a known method so as to contact with the channel region of the oxide semiconductor film 5'. The resist mask layer R may be made of a photosensitive resin, for example. Also, when viewed along a normal to the substrate 2, an end portion of the resist mask layer R suitably overlaps with the drain electrode 6d, because the first transparent electrode 7 can be extended to the vicinity of the end portion of the drain electrode 6d in that case.

Thereafter, a portion of the oxide semiconductor film 5' is subjected to the resistance lowering process L by the method described above, while the other portion of the oxide semiconductor film 5' that is covered with the source and drain electrodes 6s, 6d and the resist mask layer R is not subjected to the resistance lowering process L. As a result of the resistance lowering process L, a first transparent electrode 7 and an oxide semiconductor layer 5 are formed as described above (see FIG. 5(b)). After that, the resist mask layer R is removed by a known method.

Subsequently, as shown in FIG. 5(c), an interlayer insulating layer 8 including a dielectric layer 8a is formed over the source and drain electrodes 6s, 6d and the first transparent electrode 7 by the method described above.

And then a second transparent electrode 9 is formed on the dielectric layer 8a by the method described above, as shown in FIG. 4.

Figure 6:
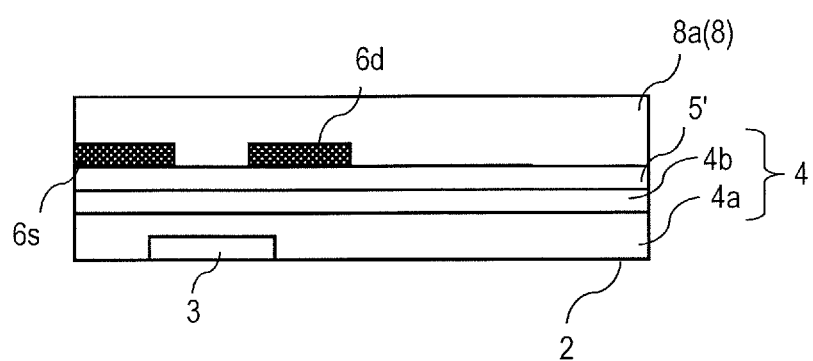
FIGS. 6 (*a*) through (*c*) are schematic cross-sectional views illustrating an exemplary manufacturing process for fabricating a TFT substrate 100B according to another embodiment of the present invention.
Figure 6:
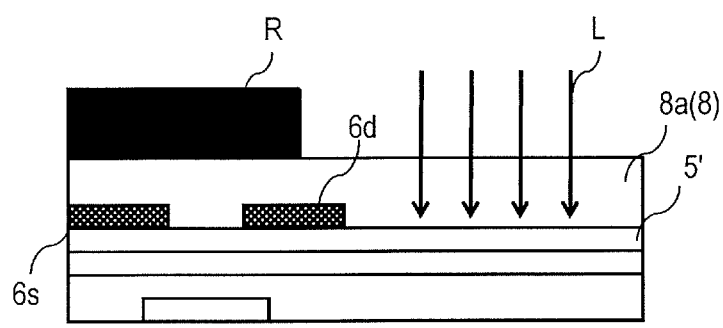
Figure 6:
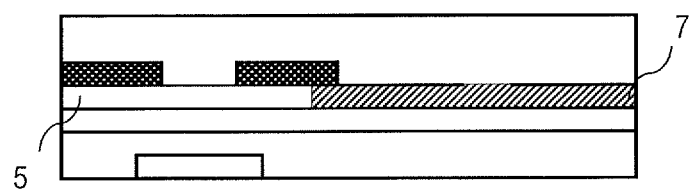

Hereinafter, another exemplary method for fabricating the TFT substrate 100B will be described with reference to FIG. 6. Specifically, FIGS. 6(a) to 6(c) are schematic cross-sectional views illustrating respective manufacturing process steps to fabricate the TFT substrate 100B.

First, a gate electrode 3, a gate insulating layer 4, an oxide semiconductor film 5' and source and drain electrodes 6s, 6d are formed as described above on a substrate 2 (see FIGS. 3(a) to 3(c)).

Next, as shown in FIG. 6(a), an interlayer insulating layer 8 including a dielectric layer 8a is formed over the source electrode 6s and the oxide conductive film 5'.

Subsequently, as shown in FIG. 6(b), a resist mask layer R to protect the channel region of the oxide conductive film 5' is formed by a known method. The resist mask layer R is formed on the dielectric layer 8a. When viewed along a normal to the substrate 2, the channel region of the oxide semiconductor film 5' overlaps with the resist mask layer R. Also, when viewed along a normal to the substrate 2, an end portion of the resist mask layer R suitably overlaps with the drain electrode 6d, because the first transparent electrode 7 can be extended to the vicinity of the end portion of the drain electrode 6d in that case.

Thereafter, a portion of the oxide semiconductor film 5' is subjected to the resistance lowering process L by the method described above, while the other portion of the oxide semiconductor film 5' that is covered with the source and drain electrodes 6s, 6d and the resist mask layer R is not subjected to the resistance lowering process L. As a result of the resistance lowering process L, a first transparent electrode 7 and an oxide semiconductor layer 5 are formed as described above (see FIG. 6(c)). After that, the resist mask layer R is removed by a known method.

And then a second transparent electrode 9 is formed on the dielectric layer 8a by the method described above, as shown in FIG. 4.

Figure 7:
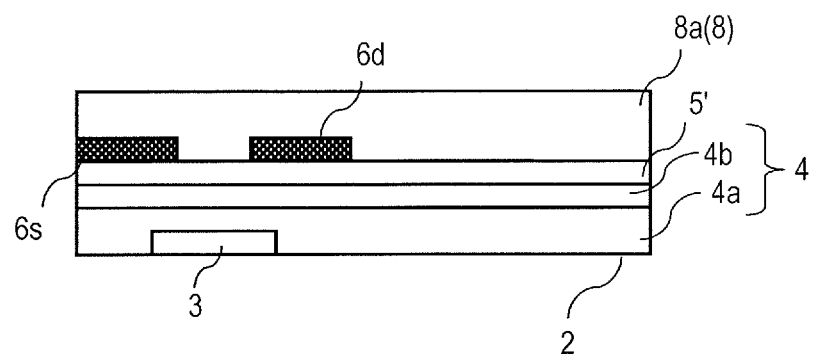
FIGS. 7 (*a*) through (*c*) are schematic cross-sectional views illustrating an exemplary manufacturing process for fabricating a TFT substrate 100B according to still another embodiment of the present invention.
Figure 7:
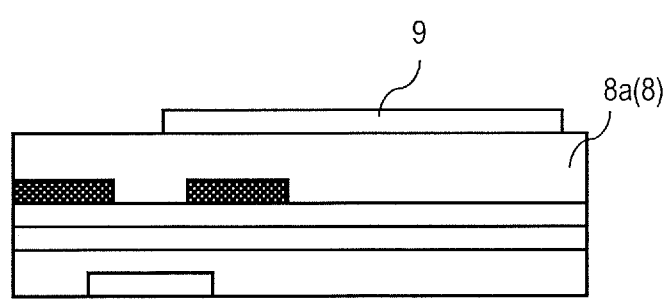
Figure 7:
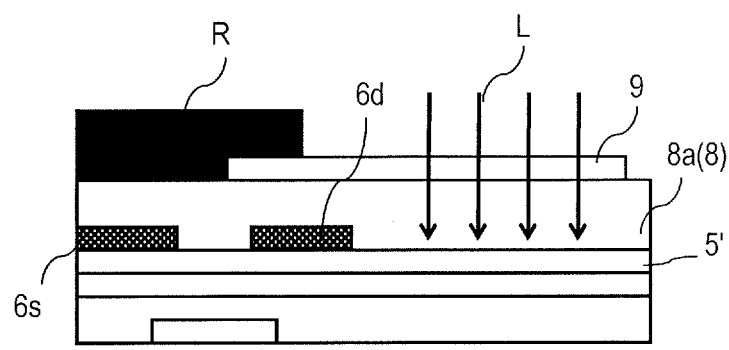

Hereinafter, still another exemplary method for fabricating the TFT substrate 100B will be described with reference to FIG. 7. Specifically, FIGS. 7(a) to 7(c) are schematic cross-sectional views illustrating respective manufacturing process steps to fabricate the TFT substrate 100B.

First, a gate electrode 3, a gate insulating layer 4, an oxide semiconductor film 5' and source and drain electrodes 6s, 6d are formed as described above on a substrate 2 (see FIGS. 3(a) to 3(c)).

Next, as shown in FIG. 7(a), an interlayer insulating layer 8 including a dielectric layer 8a is formed over the source electrode 6s and the oxide conductive film 5'. Subsequently, as shown in FIG. 7(b), a second transparent electrode 9 is formed on the dielectric layer 8a by the method described above.

Next, as shown in FIG. 7(c), a resist mask layer R to protect the channel region of the oxide conductive film 5' is formed by a known method. The resist mask layer R is formed on the dielectric layer 8a. When viewed along a normal to the substrate 2, the channel region of the oxide semiconductor film 5' overlaps with the resist mask layer R. Also, when viewed along a normal to the substrate 2, an end portion of the resist mask layer R suitably overlaps with the drain electrode 6d, because the first transparent electrode 7 can be extended to the vicinity of the end portion of the drain electrode 6d in that case.

Thereafter, a portion of the oxide semiconductor film 5' is subjected to the resistance lowering process L by the method described above, while the other portion of the oxide semiconductor film 5' that is covered with the source and drain electrodes 6s, 6d and the resist mask layer R is not subjected to the resistance lowering process L. As a result of the resistance lowering process L, a first transparent electrode 7 and an oxide semiconductor layer 5 are formed as described above (see FIG. 4). After that, the resist mask layer R is removed by a known method.

Among the methods for fabricating the TFT substrate 100B described above, if the TFT substrate 100B is fabricated by performing the resistance lowering process L with a p-type or n-type impurity doped through the dielectric layer 8a at least, a portion of the interlayer insulating layer 8 which is located over the first transparent electrode 7 is doped with the p-type or n-type impurity more heavily than the other portion thereof.

As can be seen from the foregoing description, embodiments of the present invention provide a semiconductor device which can contribute to fabricating a display panel of high display quality with the manufacturing cost cut down and also provide a method for fabricating such a semiconductor device.

INDUSTRIAL APPLICABILITY

Embodiments of the present invention are applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 2 substrate
3 gate electrode
4 gate insulating layer
4a lower gate insulating layer
4b upper gate insulating layer
5 oxide semiconductor layer
6s source electrode
6d drain electrode
7 first transparent electrode
8a interlayer insulating layer
8a dielectric layer
8b insulating protective layer
9 second transparent electrode
50 liquid crystal layer
100A semiconductor device (TFT substrate)
200 counter substrate
500 liquid crystal display device

The invention claimed is:

1. A semiconductor device comprising:
    a substrate;
    a gate electrode formed on the substrate;
    a gate insulating layer formed over the gate electrode;
    an oxide semiconductor layer formed on the gate insulating layer;
    source and drain electrodes electrically connected to the oxide semiconductor layer;
    a first transparent electrode electrically connected to the drain electrode;
    an interlayer insulating layer including a dielectric layer which has been formed over the source and drain electrodes; and
    a second transparent electrode which has been formed on the interlayer insulating layer,
    wherein at least a portion of the second transparent electrode overlaps with the first transparent electrode with the dielectric layer interposed between them, and
    the oxide semiconductor layer and the first transparent electrode are formed out of the same oxide film.

2. The semiconductor device of claim 1, wherein the drain electrode is formed on the first transparent electrode, and
    the first transparent electrode contacts directly with the drain electrode.

3. The semiconductor device of claim 1, further comprising an insulating protective layer formed on the source and drain electrodes,
    wherein the insulating protective layer is formed to contact with a channel region of the oxide semiconductor layer, and
    the insulating protective layer is made of an oxide.

4. The semiconductor device of claim 1, wherein at least one of the gate insulating layer and the dielectric layer includes an oxide insulating layer, and
    the oxide insulating layer contacts with the oxide semiconductor layer.

5. The semiconductor device of claim 1, wherein the oxide film includes In, Ga and Zn.

6. The semiconductor device of claim 1, wherein the first transparent electrode contains an impurity at a higher concentration than the oxide semiconductor layer, and
    a portion of the interlayer insulating layer located over the first transparent electrode contains the impurity at a higher concentration than the other portion thereof.

7. A method for fabricating the semiconductor device of claim 1, the method comprising the steps of:
    (a) providing the substrate;
    (b) forming the gate electrode and the gate insulating layer on the substrate;
    (c) forming an oxide semiconductor film on the gate insulating layer;
    (d) forming the source and drain electrodes on the oxide semiconductor film;
    (e) forming a protective layer to protect a channel region of the oxide semiconductor film, and then performing a resistance lowering process to lower a resistance of a portion of the oxide semiconductor film, thereby forming the first transparent electrode and turning the rest of the oxide semiconductor film where the first transparent electrode is not formed into an oxide semiconductor layer;
    (f) forming the dielectric layer over the source and drain electrodes; and
    (g) forming the second transparent electrode on the dielectric layer,
    wherein at least a portion of the second transparent electrode overlaps with the first transparent electrode with the dielectric layer interposed between them.

8. The method of claim 7, wherein the step (e) is performed between the steps (d) and (f).

9. The method of claim 7, wherein the step (e) is performed between the steps (f) and (g).

10. The method of claim 9, wherein the step (e) includes forming the first transparent electrode by implanting an impurity into a portion of the oxide semiconductor film through the dielectric layer.

11. The method of claim 7, wherein the step (e) is performed after the step (g).

12. The method of claim 11, wherein the step (e) includes forming the first transparent electrode by implanting an impurity into a portion of the oxide semiconductor film through the dielectric layer and the second transparent electrode.

13. The method of claim 8, wherein the protective layer is an oxide insulating layer.

14. The method of claim 7, wherein when viewed along a normal to the substrate, an end portion of the protective layer overlaps with the drain electrode.

15. The semiconductor device of claim 1, wherein the oxide semiconductor layer includes an In—Ga—Zn—O based semiconductor.

16. The method of claim 7, wherein the oxide semiconductor film includes an In—Ga—Zn—O based semiconductor.

\* \* \* \* \*